United States Patent
Nakajima

(10) Patent No.: US 11,417,625 B2
(45) Date of Patent: Aug. 16, 2022

(54) SEMICONDUCTOR DEVICE HAVING AN ELECTRICAL CONNECTION BETWEEN SEMICONDUCTOR CHIPS ESTABLISHED BY WIRE BONDING, AND METHOD FOR MANUFACTURING THE SAME

(71) Applicant: Murata Manufacturing Co., Ltd., Kyoto (JP)

(72) Inventor: Shizuki Nakajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/020,459

(22) Filed: Sep. 14, 2020

(65) Prior Publication Data

US 2020/0411465 A1    Dec. 31, 2020

Related U.S. Application Data

(62) Division of application No. 15/901,335, filed on Feb. 21, 2018, now Pat. No. 10,804,238.

(30) Foreign Application Priority Data

Feb. 22, 2017  (JP) .............................. JP2017-030905

(51) Int. Cl.
*H01L 23/00* (2006.01)

(52) U.S. Cl.
CPC .............. *H01L 24/48* (2013.01); *H01L 24/85* (2013.01); *H01L 24/01* (2013.01); *H01L 24/29* (2013.01);
(Continued)

(58) Field of Classification Search
CPC ......... H01L 24/48; H01L 24/85; H01L 24/01; H01L 24/29; H01L 24/32; H01L 24/45;
(Continued)

(56) References Cited

U.S. PATENT DOCUMENTS 5,328,079 A    7/1994  Mathew et al.
5,842,628 A   12/1998  Nomoto et al.
(Continued)

FOREIGN PATENT DOCUMENTS

CN    1561545 A    1/2005
CN    1996584 A    7/2007
(Continued)

OTHER PUBLICATIONS

Decision of Rejection for Chinese Patent Application No. 201711051716.4 dated Feb. 23, 2022.

*Primary Examiner* — Mohsen Ahmadi
(74) *Attorney, Agent, or Firm* — Pearne & Gordon LLP

(57) ABSTRACT

A method for manufacturing a semiconductor device includes (i) a step of preparing a first semiconductor chip having a first electrode pad thereon and a second semiconductor chip having a second electrode pad thereon and larger in thickness than the first semiconductor chip, the second electrode pad being larger in size than the first electrode pad, (ii) a step of mounting the first semiconductor chip and the second semiconductor chip on the same planarized surface of a substrate having a uniform thickness, (iii) a step of bonding a ball formed by heating and melting a bonding wire to the second electrode pad, (iv) a step of first-bonding the bonding wire to the first electrode pad, and (v) a step of second-bonding the bonding wire to the ball.

7 Claims, 4 Drawing Sheets

(52) U.S. Cl.
CPC .............. *H01L 24/32* (2013.01); *H01L 24/45* (2013.01); *H01L 24/49* (2013.01); *H01L 24/73* (2013.01); *H01L 24/78* (2013.01); *H01L 2224/04042* (2013.01); *H01L 2224/05554* (2013.01); *H01L 2224/05567* (2013.01); *H01L 2224/2919* (2013.01); *H01L 2224/32225* (2013.01); *H01L 2224/4809* (2013.01); *H01L 2224/4848* (2013.01); *H01L 2224/48096* (2013.01); *H01L 2224/48137* (2013.01); *H01L 2224/48465* (2013.01); *H01L 2224/48479* (2013.01); *H01L 2224/49052* (2013.01); *H01L 2224/73265* (2013.01); *H01L 2224/78301* (2013.01); *H01L 2224/85035* (2013.01); *H01L 2224/85051* (2013.01); *H01L 2224/85181* (2013.01); *H01L 2224/85207* (2013.01); *H01L 2924/00014* (2013.01); *H01L 2924/10253* (2013.01); *H01L 2924/10329* (2013.01)

(58) Field of Classification Search
CPC ......... H01L 24/49; H01L 24/73; H01L 24/78; H01L 2224/04042; H01L 2224/48137; H01L 2224/48465; H01L 2224/49052; H01L 2224/73265; H01L 2224/85051
See application file for complete search history.

(56) References Cited

U.S. PATENT DOCUMENTS

| | | | |
|---|---|---|---|
| 6,036,080 A * | 3/2000 | Takahashi | H01L 24/78 228/180.5 |
| 6,250,539 B1 | 6/2001 | Nishiura et al. | |
| 6,380,634 B1 * | 4/2002 | Umehara | H01L 21/4825 257/784 |
| 6,476,506 B1 | 11/2002 | O'Connor et al. | |
| 8,709,875 B2 * | 4/2014 | Yao | H01L 23/49568 257/676 |
| 9,230,946 B2 | 1/2016 | Masumura et al. | |
| 9,236,333 B2 | 1/2016 | Numazaki | |
| 2006/0216863 A1 | 9/2006 | Arakawa | |
| 2007/0158392 A1 | 7/2007 | Shimanuki | |
| 2009/0001608 A1 | 1/2009 | Mii et al. | |
| 2009/0174054 A1 | 7/2009 | Block et al. | |
| 2010/0193923 A1 | 8/2010 | Tanaka et al. | |
| 2012/0208324 A1 | 8/2012 | Harata et al. | |
| 2013/0049231 A1 * | 2/2013 | Miyoshi | H01L 24/85 257/782 |
| 2013/0256916 A1 | 10/2013 | Kwon et al. | |
| 2013/0270701 A1 | 10/2013 | Cruz et al. | |
| 2014/0167292 A1 * | 6/2014 | Masumura | H01L 24/48 257/784 |
| 2014/0332942 A1 | 11/2014 | Kanemoto | |
| 2015/0124420 A1 | 5/2015 | Heinrich et al. | |
| 2015/0130053 A1 | 5/2015 | Hara et al. | |
| 2015/0162319 A1 | 6/2015 | Scharf et al. | |
| 2015/0333039 A1 | 11/2015 | Liu et al. | |
| 2016/0155710 A1 * | 6/2016 | Kanemoto | H01L 23/49541 257/669 |
| 2016/0293816 A1 * | 10/2016 | Kaneto | H01L 29/167 |
| 2017/0179075 A1 | 6/2017 | Sato | |
| 2018/0182692 A1 * | 6/2018 | Danno | H01L 23/49551 |

FOREIGN PATENT DOCUMENTS

| | | |
|---|---|---|
| CN | 102800765 A | 11/2012 |
| CN | 104143518 A | 11/2014 |
| JP | H11-307571 A | 11/1999 |
| JP | 2006073826 A | 3/2006 |
| JP | 2006-278407 A | 10/2006 |
| JP | 2015082514 A | 4/2015 |
| TW | 301794 B | 4/1997 |
| TW | 466654 B | 12/2001 |

* cited by examiner

SEMICONDUCTOR DEVICE HAVING AN ELECTRICAL CONNECTION BETWEEN SEMICONDUCTOR CHIPS ESTABLISHED BY WIRE BONDING, AND METHOD FOR MANUFACTURING THE SAME

This is a division of U.S. patent application Ser. No. 15/901,335, filed on Feb. 21, 2018, which claims priority from Japanese Patent Application No. 2017-030905 filed on Feb. 22, 2017. The contents of these applications are incorporated herein by reference in their entireties.

BACKGROUND

The present disclosure relates to a semiconductor device and a method for manufacturing the same. In a manufacturing process which involves sealing a plurality of semiconductor chips to form a multichip package, an electrical connection between the semiconductor chips is established, for example, by wire bonding. In wire bonding between the semiconductor chips, a tip of a bonding wire inserted in a capillary tool is first melted by discharge heating to form a ball, which is then bonded in advance to an electrode pad on the semiconductor chip where second bonding is performed. Next, the bonding wire is ball-bonded by ultrasonic welding while being pressed against an electrode pad on the semiconductor chip where first bonding is performed. Next, the bonding wire is fed out while the capillary tool is being moved. Then, the bonding wire is stitch-bonded by ultrasonic welding while being pressed against the ball formed in advance on the electrode pad on the semiconductor chip where second bonding is performed. For example, Japanese Unexamined Patent Application Publication No. 2006-278407 refers to such wire bonding between semiconductor chips.

In wire bonding between semiconductor chips, a technique of performing second bonding on the thinner of two semiconductor chips is most commonly used. For convenience, this technique is referred to as "downward wire bonding". On the other hand, a technique of performing second bonding on the thicker of two semiconductor chips is referred to as "upward wire bonding" for convenience. A reason for which the downward wire bonding is most commonly used is that it is relatively easy, with the downward wire bonding, to increase to some extent the connection angle formed by the bonding wire and the semiconductor chip where second bonding is performed, and that this is convenient for maintaining the connection strength of the bonding wire. To increase this connection angle to some extent with upward wire bonding, the bonding wire needs to be routed to a high position or routed into a substantially trapezoidal loop. Such routing of the bonding wire not only leads to increased costs, but also makes it unable to meet demands for compact, low-profile multichip packages.

When the bonding wire is stitch-bonded by ultrasonic welding while being pressed against the ball formed in advance on the electrode pad on the semiconductor chip where second bonding is performed, the ball is crushed and spread over the electrode pad. Therefore, the electrode pad on the semiconductor chip where second bonding is performed needs to be larger in size than the electrode pad on the semiconductor chip where first bonding is performed.

In the light of such circumstances, when a thicker semiconductor chip including a silicon semiconductor substrate and a thinner semiconductor chip including a compound semiconductor substrate are wire-bonded by downward wire bonding, second bonding is performed on the semiconductor chip including the compound semiconductor substrate. However, increasing the size of electrode pads on the semiconductor chip including the compound semiconductor substrate, which is more costly than the semiconductor chip including the silicon semiconductor substrate, leads to increased costs. Moreover, if the material of the electrode pads on the silicon semiconductor substrate differs from the material of bonding wires, it is difficult to ensure sufficient bonding strength between the electrode pads and the bonding wires.

BRIEF SUMMARY

Accordingly, the present disclosure solves at least some of the problems described above.

To solve the problems described above, a method for manufacturing a semiconductor device according to embodiments of the present disclosure includes (i) a step of preparing a first semiconductor chip having a first electrode pad thereon and a second semiconductor chip having a second electrode pad thereon and larger in thickness than the first semiconductor chip, the second electrode pad having surface dimensions larger than the first electrode pad, (ii) a step of mounting the first semiconductor chip and the second semiconductor chip on the same planar surface of a substrate having a uniform thickness, (iii) a step of bonding a ball formed by heating and melting a bonding wire to the second electrode pad, (iv) a step of first-bonding the bonding wire to the first electrode pad, and (v) a step of second-bonding the bonding wire to the ball. The bonding wire bends in a substantially V-shape or U-shape. The bonding wire and an imaginary line connecting ends of the bonding wire create a triangular or trapezoidal shape when viewed in a direction perpendicular to the planarized surface of the substrate.

With the method for manufacturing a semiconductor device according to embodiments of the present disclosure, the manufacturing cost can be reduced by using, as the second semiconductor chip, a semiconductor chip which is less expensive to manufacture than the first semiconductor chip. Also, by bending the bonding wire into a substantially triangular or trapezoidal shape, the connection angle formed by the bonding wire and the second electrode pad on the second semiconductor chip where second bonding is performed can be increased to some extent. This makes it possible to ensure sufficient bonding strength between the bonding wire and the second electrode pad on the second semiconductor chip.

Other features, elements, and characteristics of the present disclosure will become more apparent from the following detailed description of embodiments of the present disclosure with reference to the attached drawings.

DETAILED DESCRIPTION

Figure 1:
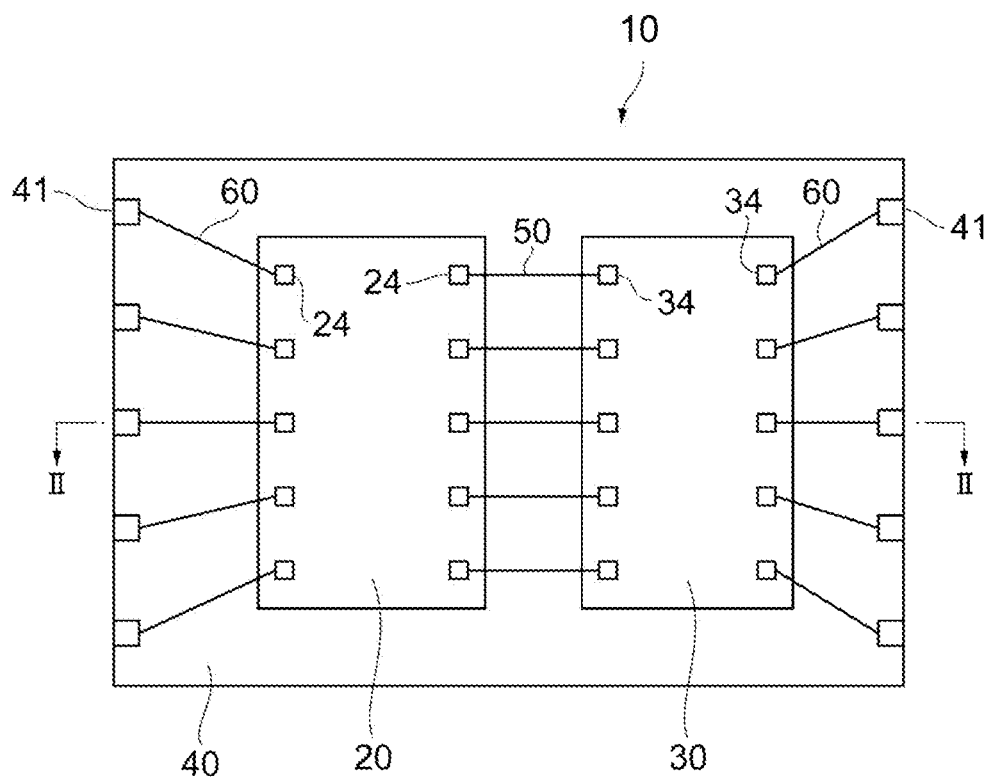
FIG. 1 is a plan view schematically illustrating a configuration of a semiconductor device according to the present embodiment.

Embodiments of the present disclosure will now be described with reference to FIGS. 1 to 8. Note that the same reference numerals denote the same components, and redundant descriptions will be omitted.

Figure 2:
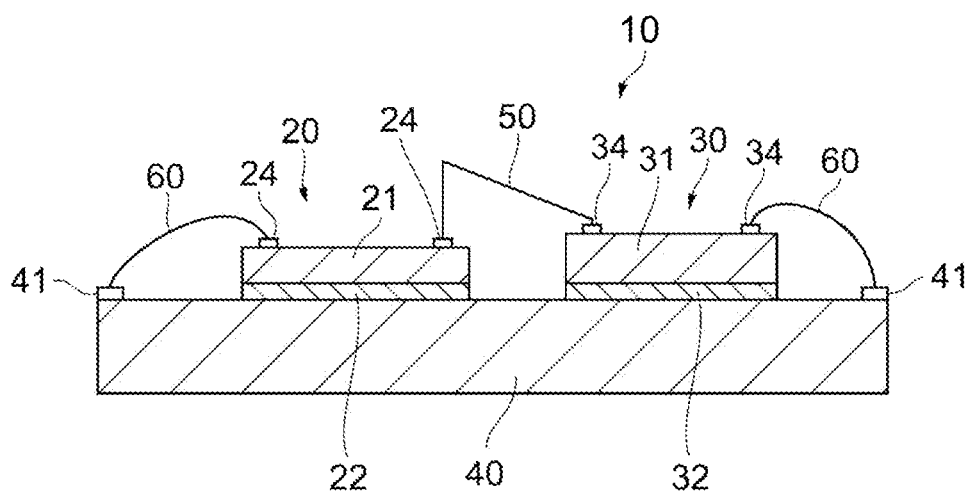
FIG. 2 is a cross-sectional view as seen in the direction of arrows along line II-II of FIG. 1.

FIG. 1 is a plan view schematically illustrating a configuration of a semiconductor device 10 according to the present embodiment. FIG. 2 is a cross-sectional view as seen in the direction of arrows along line II-II of FIG. 1. The semiconductor device 10 includes a semiconductor chip 20 having a plurality of electrode pads 24 thereon, a semiconductor chip 30 having a plurality of electrode pads 34 thereon, and a package substrate 40 having the semiconductor chips 20 and 30 mounted thereon. An adhesive layer 22 for bonding the back surface of the semiconductor chip 20 and the front surface of the package substrate 40 is interposed therebetween. Similarly, an adhesive layer 32 for bonding the back surface of the semiconductor chip 30 and the front surface of the package substrate 40 is interposed therebetween. The package substrate 40 has a uniform thickness, and the front surface of the package substrate 40 is planarized. Some of the electrode pads 24 on the semiconductor chip 20 are connected by respective bonding wires 50 to corresponding ones of the electrode pads 34 on the semiconductor chip 30. A plurality of lead terminals 41 are formed on the front surface of the package substrate 40. The other electrode pads 24 on the semiconductor chip 20 are connected by respective bonding wires 60 to corresponding ones of the lead terminals 41. Similarly, the other electrode pads 34 on the semiconductor chip 30 are connected by respective bonding wires 60 to corresponding ones of the lead terminals 41.

Figure 3:
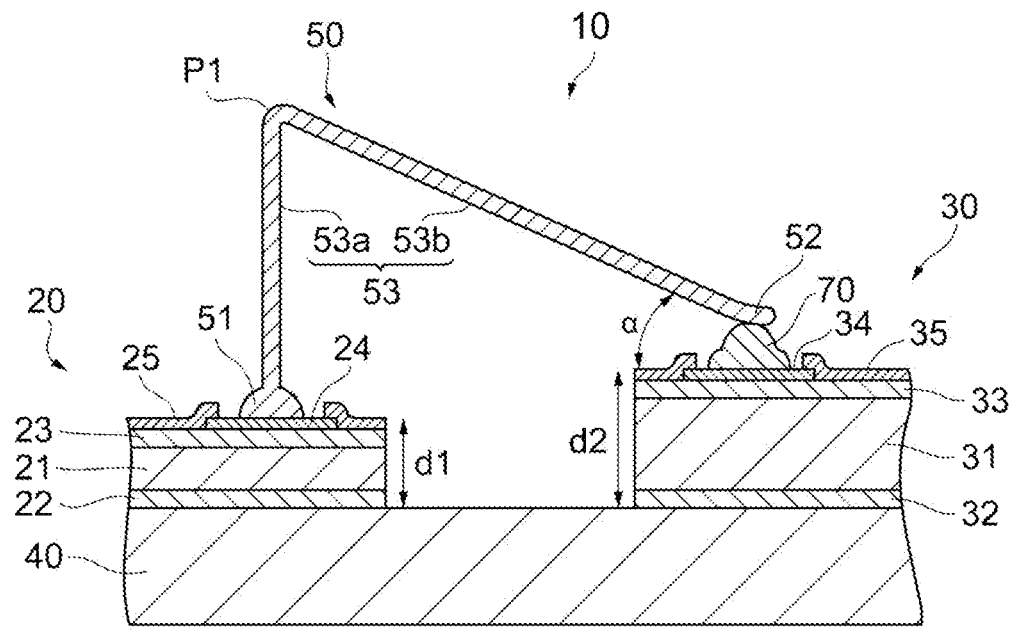
FIG. 3 is an enlarged cross-sectional view of a portion between semiconductor chips of the semiconductor device according to the present embodiment.

FIG. 3 is an enlarged cross-sectional view of a portion between the semiconductor chips 20 and 30. The semiconductor chip 20 is formed by a semiconductor substrate 21, and an interlayer insulating film 23 is interposed between the electrode pad 24 and the semiconductor substrate 21. The front surface of the semiconductor chip 20 is coated with a protective film 25. The semiconductor substrate 21 is, for example, a compound semiconductor substrate, such as a gallium arsenide (GaAs) semiconductor substrate. Similarly, the semiconductor chip 30 is formed by a semiconductor substrate 31, and an interlayer insulating film 33 is interposed between the electrode pad 34 and the semiconductor substrate 31. The front surface of the semiconductor chip 30 is coated with a protective film 35. The semiconductor substrate 31 is, for example, a silicon semiconductor substrate. A thickness d2 of the semiconductor chip 30 is greater than a thickness d1 of the semiconductor chip 20. Note that although the semiconductor chips 20 and 30 are sealed with resin, the illustration of the resin is omitted for convenience of explanation.

The bonding wires 50 are each formed, through upward wire bonding, by being first-bonded (ball-bonded) to the electrode pad 24 on the semiconductor chip 20 and second-bonded (stitch-bonded) to the electrode pad 34 on the semiconductor chip 30. Before the second bonding, a ball 70 is formed on the electrode pad 34 in advance. The ball 70 is a portion formed into a substantially hemispherical shape by the action of surface tension in the process of heating and melting a tip of the bonding wire 50 and cut off from the bonding wire 50. The ball 70 serves as a bump electrode. The bonding wire 50 includes a first bonding portion 51 formed by first bonding, a second bonding portion 52 formed by second bonding, and a bridging portion 53 that connects the first bonding portion 51 and the second bonding portion 52. The first bonding portion 51 is a portion bonded to the electrode pad 24. While being ball-bonded to the electrode pad 24, the first bonding portion 51 is formed into a substantially hemispherical shape by the action of surface tension in the process of heating and melting a tip of the bonding wire 50. The second bonding portion 52 is a portion bonded to the ball 70. While being stitch-bonded to the ball 70, the second bonding portion 52 is crushed into a thinner shape in the process of pressing the bonding wire 50 against the ball 70. The bridging portion 53 is a loop portion that connects the first bonding portion 51 to the second bonding portion 52. The bridging portion 53 includes two parts 53a and 53b. For convenience of explanation, a position higher than the position of the ball 70 is referred to as a position P1. The part 53a extends perpendicularly from the electrode pad 24 to the position P1 to connect the electrode pad 24 to the position P1. The part 53b substantially linearly connects the position P1 to the electrode pad 34. The bonding wire 50 including the parts 53a and 53b bends at the position P1 in a V-shape. When viewed in a direction perpendicular to the planarized surface of the package substrate 40, the bonding wire 50 and an imaginary line connecting the first bonding portion 51 and the second bonding portion 52 create a substantially triangular shape. The angle at the position P1 of the substantially triangular shape can be rounded due to the nature of the bonding wire 50. By mounting the semiconductor chips 20 and 30 on the same planarized surface of the package substrate 40 and reducing the difference in thickness between the semiconductor chips 20 and 30 (d2−d1), a connection angle α formed by the bonding wire 50 and the electrode pad 34 can be increased to some extent. This makes it easier to ensure connection strength of the bonding wire 50. This is particularly effective when the material of the electrode pad 34 differs from the material of the bonding wire 50. Since the ball 70 is crushed by stitch bonding thereto, the size of the electrode pad 34 is larger than the size of the electrode pad 24. Here, the sizes of the electrode pads 24 and 34 mean the areas (opening areas) of the electrode pads 24 and 34 exposed from the protective films 25 and 35, respectively.

Figure 4:
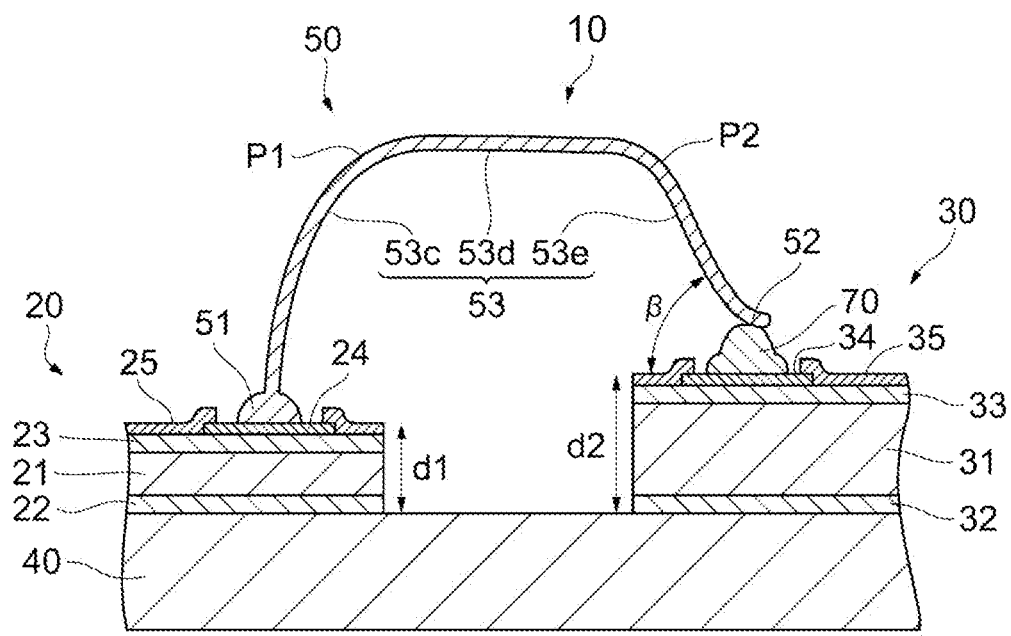
FIG. 4 is an enlarged cross-sectional view of a portion between semiconductor chips of a semiconductor device according to a modification of the present embodiment.

FIG. 4 is an enlarged cross-sectional view of a portion between the semiconductor chips 20 and 30 of the semiconductor device 10 according to a modification of the present embodiment. The bridging portion 53 of the bonding wire 50 according to this modification includes three parts 53c, 53d, and 53e. For convenience of explanation, a position at substantially the same height as the height of the position P1 is referred to as a position P2. Note that the distance between the position P2 and the electrode pad 34 is shorter than the distance between the position P2 and the electrode pad 24. The part 53c connects the electrode pad 24 to the position P1. The part 53d substantially linearly connects the position P1 to the position P2. The bonding wire 50 including the parts 53c, 53d, and 53e bends at the positions P1 and P2 in a U-shape. When viewed in a direction perpendicular to the planarized surface of the package substrate 40, the bonding wire 50 and an imaginary line connecting the first bonding portion 51 and the second bonding portion 52 create a substantially trapezoidal shape. The angles at the positions P1 and P2 of the substantially trapezoidal shape can be rounded due to the nature of the bonding wire 50. As described above, the bonding wire 50 illustrated in FIG. 4 differs from the bonding wire 50 illustrated in FIG. 3 in that the bonding wire 50 illustrated in FIG. 4 bends in a substantially U-shape that creates a trapezoidal shape whereas the bonding wire 50 illustrated in FIG. 3 bends in a substantially V-shape that creates a triangular shape. By bending the bonding wire 50 into a substantially trapezoidal shape, a connection angle β formed by the bonding wire 50 and the semiconductor chip 30 where second bonding is performed can be increased to some extent. This makes it possible to ensure sufficient bonding strength between the bonding wire 50 and the electrode pad 34 on the semiconductor chip 30. This is particularly effective when the material of the electrode pad 34 differs from the material of the bonding wire 50. As compared to bending the bonding wire 50 into a substantially triangular shape, bending the bonding wire 50 into a substantially trapezoidal shape can make it easier to reduce the profile and length of the bonding wire 50.

Figure 5:
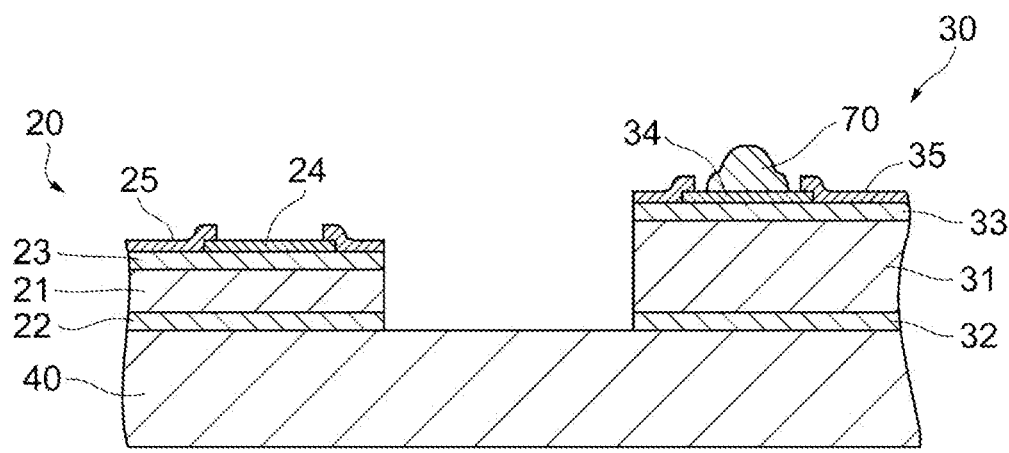
FIG. 5 is a cross-sectional view illustrating a step of manufacturing the semiconductor device according to the present embodiment.
Figure 6:
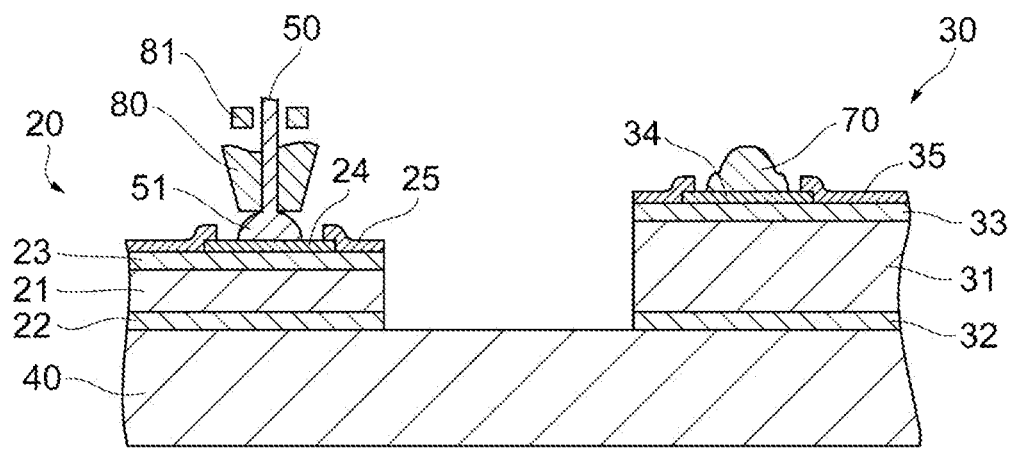
FIG. 6 is a cross-sectional view illustrating another step of manufacturing the semiconductor device according to the present embodiment.

A method for manufacturing the semiconductor device 10 illustrated in FIG. 3 will now be described with reference to FIGS. 5 to 8. First, as illustrated in FIG. 5, the semiconductor chip 20 having the electrode pad 24 thereon and the semiconductor chip 30 having the electrode pad 34 thereon are prepared. Next, the semiconductor chip 20 and the semiconductor chip 30 are mounted on the same planarized surface of the package substrate 40 having a uniform thickness. Then, the ball 70 is formed on the electrode pad 34 on the semiconductor chip 30. The ball 70 is a portion obtained by heating and melting a tip of the bonding wire 50 and cut it off from the bonding wire 50. Next, as illustrated in FIG. 6, the bonding wire 50 is inserted into a capillary tool 80, and a substantially hemispherical ball is formed using spark discharge at a tip of the bonding wire 50 protruding from the tip of the capillary tool 80. By pressing this ball against the electrode pad 24 using ultrasonic welding, the first bonding portion 51 bonded to electrode pad 24 is formed.

Figure 7:
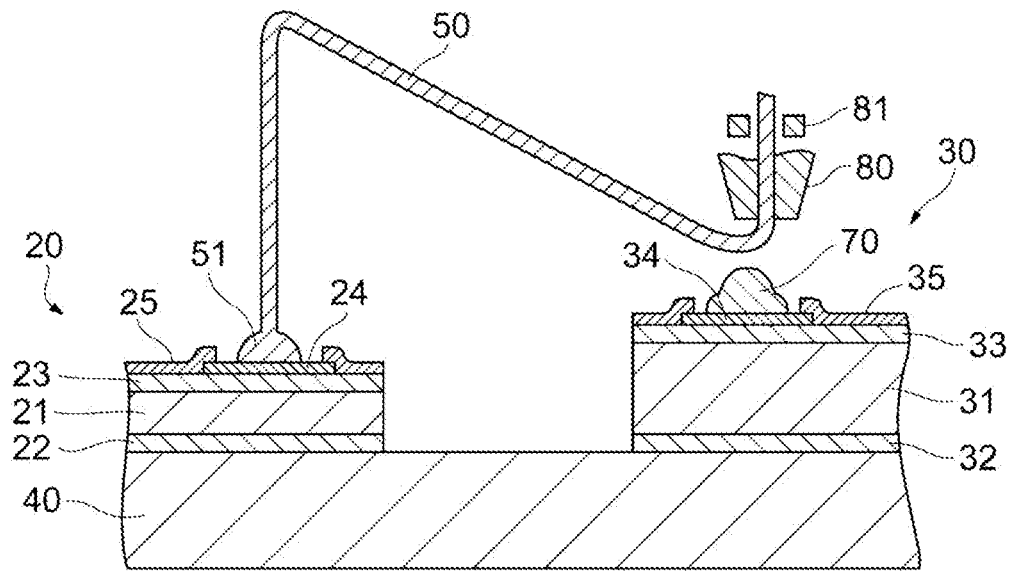
FIG. 7 is a cross-sectional view illustrating another step of manufacturing the semiconductor device according to the present embodiment.
Figure 8:
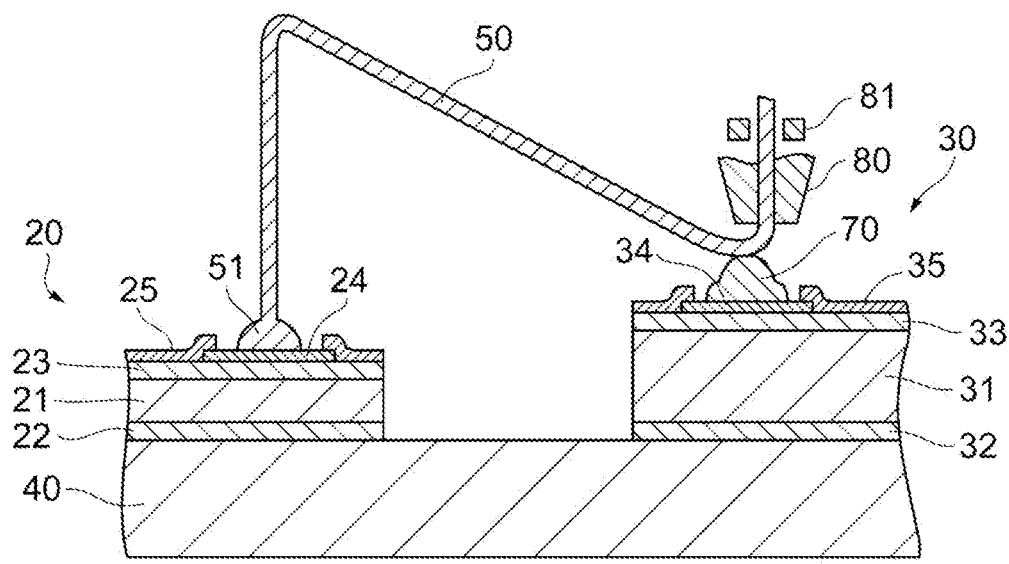
FIG. 8 is a cross-sectional view illustrating another step of manufacturing the semiconductor device according to the present embodiment.

Next, as illustrated in FIG. 7, the bonding wire 50 is extended from the electrode pad 24 to the electrode pad 34 by moving the capillary tool 80. Next, as illustrated in FIG. 8, the tip of the capillary tool 80 presses the bonding wire 50 against the ball 70 to bond the bonding wire 50 to the ball 70 using ultrasonic welding. A thinner portion of the bonding wire 50 formed by being crushed by this pressing process serves as the second bonding portion 52 bonded to the ball 70. Next, the portion of the bonding wire 50 inserted in the capillary tool 80 is secured by a clamper 81, and the bonding wire 50 is cut by moving the capillary tool 80 in a vertical upward direction. The manufacture of the semiconductor device 10 is completed by sealing the semiconductor chips 20 and 30 with resin.

For example, a semiconductor chip including a gallium arsenide semiconductor substrate and having a thickness of about 75 μm may be used as the semiconductor chip 20, and a semiconductor chip including a silicon semiconductor substrate and having a thickness of about 100 μm may be used as the semiconductor chip 30. Therefore, although the semiconductor chip 20 is more expensive to manufacture than the semiconductor chip 30, the area of the electrode pad 24 can be made smaller than the area of the electrode pad 34. Also, by making the difference in thickness between the semiconductor chips 20 and 30 as small as about 25 μm, it becomes easier to increase the connection angle formed by the second bonding portion 52 and the electrode pad 34 to some extent, and ensure connection strength of the bonding wire 50.

The method for manufacturing the semiconductor device 10 illustrated in FIG. 4 is the same as the method for manufacturing the semiconductor device 10 illustrated in FIG. 3.

The combination of the semiconductor chips 20 and 30 is not limited to the example described above. The present disclosure is also applicable to the case where the semiconductor chip 30 is more expensive to manufacture and thinner in thickness than the semiconductor chip 20. For distinction between the semiconductor chips 20 and 30, the semiconductor chip 20 may be referred to as a first semiconductor chip and the semiconductor chip 30 may be referred to as a second semiconductor chip. For distinction between the electrode pads 24 and 34, the electrode pad 24 may be referred to as a first electrode pad and the electrode pad 34 may be referred to as a second electrode pad. For distinction between the parts 53a and 53b, the part 53a may be referred to as a first part and the part 53b may be referred to as a second part. For distinction between the parts 53c, 53d, and 53e, the part 53c may be referred to as a first part, the part 53d may be referred to as a second part, and the part 53e may be referred to as a third part. For distinction between the positions P1 and P2, the position P1 may be referred to as a first position and the position P2 may be referred to as a second position. The package substrate 40 may be simply referred to as a substrate. In the present specification, the term "height" means a distance in a direction perpendicular to a reference surface, which is the front surface of the package substrate 40.

The embodiments described above are intended to facilitate understanding of the present invention, and are not intended to interpret the present invention in a limiting sense. The present invention can be changed or improved without departing from the spirit thereof, and includes equivalents thereof. That is, embodiments to which design changes are appropriately made by those skilled in the art are also included in the scope of the present invention, as long as they have the features of the present invention. For example, the elements of the embodiments and their arrangements are not limited to the illustrated ones and can be changed appropriately.

What is claimed is:

1. A semiconductor device comprising:
   a first semiconductor chip having a first electrode pad thereon;
   a second semiconductor chip having a second electrode pad thereon and being larger in thickness than the first semiconductor chip, the second electrode pad being larger in size than the first electrode pad;
   a first protective layer that extends over the first electrode pad and defines a first opening area of the first electrode pad, exposing the first electrode pad from the first protective layer;
   a second protective layer that extends over the second electrode pad and defines a second opening area of the second electrode pad, exposing the second electrode pad from the second protective layer, the first opening area being smaller than the second opening area;
   a ball bonded to the second electrode pad; and
   a bonding wire including:
   a first bonding portion bonded to the first electrode pad, a first wire portion that extends perpendicularly from the first bonding portion to a first position higher than a position of the ball, a second bonding portion bonded to the ball, and a second wire portion that extends from the first position to the second bonding portion attached to the ball, the second wire portion extending transverse to the first wire portion, and wherein the thinner first semiconductor chip comprises a compound semiconductor substrate and the thicker second semiconductor chip comprises a silicon semiconductor substrate.

2. The semiconductor device according to claim 1, wherein the bonding wire bends at the first position, the bonding wire and an imaginary line connecting the first wire portion and the second wire portion being in a substantially triangular shape when viewed in a direction perpendicular to a planarized surface of the substrate.

3. The semiconductor device according to claim 1, wherein the compound semiconductor substrate is a gallium arsenide semiconductor substrate.

4. The semiconductor device according to claim 1, wherein:

the first semiconductor chip and second semiconductor chip are mounted on a substrate surface, and the thickness of the first semiconductor chip is in a stacking direction of the first semiconductor chip and the substrate surface, and the thickness of the second semiconductor chip is in a stacking direction of the second semiconductor chip and the substrate surface.

5. The semiconductor device according to claim 1, wherein the second bonding portion is stitch-bonded to the ball.

6. The semiconductor device according to claim 1, wherein:

the first bonding portion is formed in a substantially hemispherical shape and is integrally connected to the first wire portion.

7. The semiconductor device according to claim 6, wherein the second bonding portion is stitch-bonded to the ball.

* * * * *